(12) United States Patent
Nordling et al.

(10) Patent No.: US 8,642,900 B2
(45) Date of Patent: Feb. 4, 2014

(54) MODULAR ELECTROMAGNETICALLY SHIELDED ENCLOSURE

(75) Inventors: Gale Nordling, Excelsior, MN (US); David Blake Jackson, Excelsior, MN (US); Frederick R. Faxvog, Long Lake, MN (US); James Nicholas Ruehl, Excelior, MN (US); Wallace Jensen, Centerville, MN (US); Greg Fuchs, River Falls, WI (US); George Anderson, Champlin, MN (US)

(73) Assignee: Emprimus, LLC, St. Louis Park, MN (US)

( * ) Notice: Subject to any disclaimer, the term of this patent is extended or adjusted under 35 U.S.C. 154(b) by 377 days.

(21) Appl. No.: 12/906,875

(22) Filed: Oct. 18, 2010

(65) Prior Publication Data

US 2011/0088940 A1    Apr. 21, 2011

Related U.S. Application Data

(60) Provisional application No. 61/252,534, filed on Oct. 16, 2009, provisional application No. 61/293,981, filed on Jan. 11, 2010, provisional application No. 61/330,820, filed on May 3, 2010.

(51) Int. Cl.
*H05K 9/00* (2006.01)
*E04H 1/00* (2006.01)

(52) U.S. Cl.
USPC ........... 174/382; 174/384; 174/387; 361/816; 52/79.8

(58) Field of Classification Search
USPC ........ 174/382, 384, 387; 250/517.1; 361/816; 52/79.8
See application file for complete search history.

(56) References Cited

U.S. PATENT DOCUMENTS

| 3,009,984 A | 11/1961 | Lindgren |
| 3,075,818 A | 1/1963 | Fay |
| 3,158,016 A | 11/1964 | Fay |

(Continued)

FOREIGN PATENT DOCUMENTS

| EP | 0 668 692 A1 | 8/1995 |
| EP | 1 114 423 B1 | 2/2007 |
| GB | 294513 | 7/1928 |
| JP | 11-239288 | 8/1999 |

OTHER PUBLICATIONS

Military Handbook 235-1B, Electromagnetic (Radiated) Environment Considerations for Design and Procurement of Electrical and Electronic Equipment, Subsystems and Systems, Part 1B, General Guidance, 20 Pages, 1993.

(Continued)

*Primary Examiner* — Hung Ngo
(74) *Attorney, Agent, or Firm* — Merchant & Gould, P.C.

(57) ABSTRACT

An electromagnetically shielded enclosure is disclosed. One such system includes a continuously welded shell having a top, a bottom, and a plurality of side walls cooperating to enclose an interior volume, the interior volume sized to receive electronic equipment and allow human entry. The enclosure is constructed from electromagnetically conductive materials and includes continuous welds along seams joining each material. The enclosure includes a sally port located within the enclosure. The sally port includes a first door in one of the plurality of side walls and constructed from electromagnetically conductive materials. The sally port also includes a second door constructed from electromagnetically conductive materials. The sally port defines a secondary interior volume within the enclosure sized to allow human entry through either the first or second door.

32 Claims, 5 Drawing Sheets

(56) References Cited

U.S. PATENT DOCUMENTS

| | | | |
|---|---|---|---|
| 3,189,394 A | 6/1965 | Fay | |
| 3,231,663 A | 1/1966 | Schwartz | |
| 3,297,383 A | 1/1967 | Fay | |
| 3,390,491 A * | 7/1968 | Hayden et al. | 174/379 |
| 3,962,550 A | 6/1976 | Kaiserswerth | |
| D245,303 S | 8/1977 | Gazarek | |
| 4,060,709 A | 11/1977 | Hanson | |
| 4,066,305 A | 1/1978 | Gazarek | |
| D248,003 S | 5/1978 | Gazarek | |
| 4,102,554 A | 7/1978 | Reimer | |
| 4,115,656 A * | 9/1978 | Aitel | 174/380 |
| 4,177,353 A | 12/1979 | McCormack | |
| 4,655,012 A | 4/1987 | Downey et al. | |
| 4,660,014 A | 4/1987 | Wenaas et al. | |
| 4,677,251 A | 6/1987 | Merewether | |
| 4,691,483 A | 9/1987 | Anderson | |
| 4,748,790 A | 6/1988 | Frangolacci | |
| 4,750,957 A * | 6/1988 | Gustafson | 156/92 |
| 4,755,630 A | 7/1988 | Smith et al. | |
| H526 H | 9/1988 | Miller | |
| 4,787,181 A | 11/1988 | Witten et al. | |
| D300,097 S | 3/1989 | Cook | |
| 4,884,171 A | 11/1989 | Maserang et al. | |
| 4,894,489 A | 1/1990 | Takahashi et al. | |
| 4,913,476 A | 4/1990 | Cook | |
| 5,045,636 A | 9/1991 | Johnasen et al. | |
| 5,079,388 A | 1/1992 | Balsells | |
| 5,117,066 A | 5/1992 | Balsells | |
| 5,136,119 A * | 8/1992 | Leyland | 174/379 |
| 5,136,453 A | 8/1992 | Oliver | |
| 5,148,111 A | 9/1992 | Shiloh et al. | |
| 5,179,489 A | 1/1993 | Oliver | |
| 5,184,311 A | 2/1993 | Kraus et al. | |
| 5,190,479 A | 3/1993 | Jordi | |
| 5,191,544 A | 3/1993 | Benck et al. | |
| 5,241,132 A | 8/1993 | McCormack | |
| 5,436,786 A | 7/1995 | Pelly et al. | |
| 5,465,534 A | 11/1995 | Mittag | |
| 5,594,200 A | 1/1997 | Ramsey | |
| 5,600,290 A | 2/1997 | Anderson, II | |
| 5,685,358 A | 11/1997 | Kawasaki et al. | |
| 5,749,178 A * | 5/1998 | Garmong | 52/79.1 |
| 5,751,530 A | 5/1998 | Pelly et al. | |
| 5,828,220 A | 10/1998 | Carney et al. | |
| 5,983,578 A | 11/1999 | Huttie et al. | |
| 6,011,504 A * | 1/2000 | Tan | 342/4 |
| 6,068,009 A * | 5/2000 | Paes et al. | 135/117 |
| 6,090,728 A | 7/2000 | Yenni, Jr. et al. | |
| 6,157,546 A | 12/2000 | Petty et al. | |
| 6,185,065 B1 | 2/2001 | Hasegawa et al. | |
| 6,210,787 B1 | 4/2001 | Goto et al. | |
| 6,292,373 B1 | 9/2001 | Li et al. | |
| 6,320,123 B1 | 11/2001 | Reimers | |
| 6,324,075 B1 | 11/2001 | Unrein et al. | |
| 6,346,330 B1 | 2/2002 | Huang et al. | |
| 6,377,473 B1 | 4/2002 | Huang et al. | |
| 6,380,482 B1 | 4/2002 | Norte et al. | |
| 6,426,459 B1 | 7/2002 | Mitchell | |
| 6,442,046 B1 | 8/2002 | Sauer | |
| 6,485,595 B1 | 11/2002 | Yenni, Jr. et al. | |
| 6,542,380 B1 | 4/2003 | Hailey et al. | |
| 6,542,384 B1 | 4/2003 | Radu et al. | |
| 6,613,979 B1 | 9/2003 | Miller et al. | |
| 6,683,245 B1 | 1/2004 | Ogawa et al. | |
| 6,838,613 B2 | 1/2005 | Kopf | |
| 6,870,092 B2 | 3/2005 | Lambert et al. | |
| 6,872,971 B2 | 3/2005 | Hutchinson et al. | |
| 6,891,478 B2 | 5/2005 | Gardner | |
| 7,071,631 B2 | 7/2006 | Howard, II | |
| 7,210,557 B2 | 5/2007 | Phillips et al. | |
| 7,258,574 B2 | 8/2007 | Barringer et al. | |
| 7,369,416 B2 | 5/2008 | Plabst | |
| 7,418,802 B2 | 9/2008 | Sarine et al. | |
| 7,420,742 B2 | 9/2008 | Wood et al. | |
| 7,475,624 B1 | 1/2009 | Daily | |
| 7,498,524 B2 | 3/2009 | Brench | |
| 7,504,590 B2 | 3/2009 | Ball | |
| 7,512,430 B2 | 3/2009 | Nakamura | |
| 7,515,219 B2 | 4/2009 | Bozzer et al. | |
| 7,560,135 B2 | 7/2009 | Kotsubo et al. | |
| 7,561,444 B2 | 7/2009 | He | |
| 7,576,289 B2 | 8/2009 | Kessel | |
| 7,589,943 B2 | 9/2009 | Ramirez et al. | |
| 7,710,708 B2 | 5/2010 | Park et al. | |
| 7,839,020 B2 | 11/2010 | Nakanishi | |
| 8,085,554 B2 | 12/2011 | Holdredge et al. | |
| 8,351,221 B2 | 1/2013 | Siomkos et al. | |
| 8,358,512 B2 | 1/2013 | Shiroishi et al. | |
| 8,358,515 B2 | 1/2013 | Chen et al. | |
| 8,373,998 B2 | 2/2013 | Ricci et al. | |
| 8,406,012 B2 | 3/2013 | Kim | |
| 2001/0046128 A1 | 11/2001 | Ogata | |
| 2003/0024172 A1 | 2/2003 | Lyons et al. | |
| 2003/0029101 A1 * | 2/2003 | Lyons | 52/79.1 |
| 2003/0042990 A1 * | 3/2003 | Schumacher | 333/12 |
| 2003/0174487 A1 | 9/2003 | Garmong | |
| 2004/0112205 A1 | 6/2004 | MacDougall | |
| 2004/0232847 A1 | 11/2004 | Howard, II | |
| 2005/0174749 A1 | 8/2005 | Liikamaa et al. | |
| 2005/0247471 A1 * | 11/2005 | Archambeault et al. | 174/35 MS |
| 2006/0272857 A1 | 12/2006 | Arnold | |
| 2006/0274517 A1 | 12/2006 | Coffy | |
| 2007/0002547 A1 * | 1/2007 | Garmong | 361/752 |
| 2007/0025095 A1 | 2/2007 | Beall et al. | |
| 2007/0093135 A1 * | 4/2007 | Luo et al. | 439/610 |
| 2007/0105445 A1 | 5/2007 | Manto et al. | |
| 2007/0126871 A1 | 6/2007 | Henninger, III et al. | |
| 2007/0127129 A1 | 6/2007 | Wood et al. | |
| 2007/0158914 A1 | 7/2007 | Tammaro et al. | |
| 2008/0050172 A1 | 2/2008 | Simola et al. | |
| 2008/0080158 A1 | 4/2008 | Crocker et al. | |
| 2008/0250726 A1 | 10/2008 | Slagel et al. | |
| 2009/0067141 A1 | 3/2009 | Dabov et al. | |
| 2009/0125316 A1 | 5/2009 | Moore | |
| 2009/0140499 A1 | 6/2009 | Kline | |
| 2009/0229194 A1 | 9/2009 | Armillas | |
| 2009/0244876 A1 | 10/2009 | Li et al. | |
| 2009/0268420 A1 | 10/2009 | Long | |
| 2009/0278729 A1 | 11/2009 | Bosser et al. | |
| 2009/0291608 A1 | 11/2009 | Choi et al. | |
| 2010/0103628 A1 | 4/2010 | Steffler | |
| 2010/0116542 A1 | 5/2010 | Sugihara et al. | |
| 2010/0128455 A1 | 5/2010 | Ophoven et al. | |
| 2010/0208433 A1 | 8/2010 | Heimann et al. | |
| 2010/0315199 A1 * | 12/2010 | Slagel | 340/5.7 |
| 2010/0315792 A1 | 12/2010 | Jones | |
| 2011/0222249 A1 * | 9/2011 | Ruehl et al. | 361/752 |
| 2013/0152485 A1 * | 6/2013 | Austin et al. | 52/79.8 |
| 2013/0170159 A1 | 7/2013 | Jiang | |

OTHER PUBLICATIONS

Military Handbook 237B, Department of Defense Handbook, Guidance for Controlling Electromagnetic Environmental Effects on Platforms, Systems, and Equipment, 248 Pages, 1997.

Military Handbook 253, Guidance for the Design and Test of Systems Protected Against the Effects of Electromagnetic Energy, 27 Pages, 1978.

Military Handbook 273, Survivability Enhancement, Aircraft, Nuclear Weapon Threat, Design and Evaluation Guidelines, 228 Pages, 1983.

Military Handbook 411B, Power and the Environment for Sensitive DoD Electronic Equipment (General), vol. 1, 658 pages, 1990.

Military Handbook 419A, Grounding, Bonding, and Shielding for Electronic Equipments and Facilities, vol. 1 of 2 vols., Basic Theory, 812 Pages, 1987.

Military Handbook 1857, Grounding, Bonding and Shielding Design Practices, 185 Pages, 1998.

Military Handbook 5961A, List of Standard Semiconductor Devices, 33 pages, 1999.

Military Standard 188-124B, Grounding, Bonding and Shielding, for Common Long Haul/Tactical Communication Systems Including Ground Based Communications-Electronics Facilities and Equipments, 41 Pages, 1992.

(56) References Cited

OTHER PUBLICATIONS

Military Standard 188-125-1, Department of Defense Interface Standard, High-Altitude Electromagnetic Pulse (HEMP) Protection for Ground-Based C41 Facilities Performing Critical, Time-Urgent Missions (Part 1—Fixed Facilities), 107 Pages, 1998.
Military Standard 188-125-2, Department of Defense Interface Standard, High-Altitude Electromagnetic Pulse (HEMP) Protection for Ground-Based C41 Facilities Performing Critical, Time-Urgent Missions (Part 2—Transportable Systems), 148 Pages, 1999.
Military Standard 188-125, High-Altitude Electromagnetic Pulse (HEMP) Protection for Ground-Based C41 Facilities Performing Critical, Time-Urgent Missions (vol. 1—Fixed Facilities), 114 Pages, Feb. 1994.
Military Standard 220C, Department of Defense—Test Method Standard—Method of Insertion Loss Measurement, 19 Pages, 2009.
Military Standard 285—Notice of Cancellation—MIL-STD-285, dated 1956 canceled, 17 Pages, 1997.
Military Standard 285, Military Standard Attenuation Measurements for Enclosures, Electromagnetic Shielding, for Electronic Test Purposes, 15 Pages, 1956.
Military Standard 461C, Electromagnetic Emission and Susceptibility Requirements for the Control of Electromagnetic Interference, 183 Pages, 1986.
Military Standard 461E, Requirements for the Control of Electromagnetic Interference Characteristics of Subsystems and Equipment, 253 Pages, 1999.
Military Standard 461F, Requirements for the Control of Electromagnetic Interference Characteristics of Subsystems and Equipment, 269 Pages, 2007.
Military Standard 462, Electromagnetic Interference Characteristics, 80 Pages, 1967.
Military Standard 462D, Measurement of Electromagnetic Interference Characteristics, 203 Pages, 1993.
Military Standard 464, Electromagnetic Environmental Effects Requirements for Systems, 116 pages, 1997.
Military Standard 464A, Electromagnetic Environmental Effects Requirements for Systems, 121 pages, 2002.
Military Standard 469B, Radar Engineering Interface Requirements, Electromagnetic Compatibility, 98 Pages, 1996.
Military Standard 1542B (USAF), Electromagnetic Compatibility and Grounding Requirements for Space System Facilities, 52 Pages, 1991.
Specification NSA No. 94-106, National Security Agency Specification for Shielded Enclosures, 9 Pages, 1994.
Military Handbook 1195, Radio Frequency Shielded Enclosures, 86 Pages, Sep. 1988.
IEEE Std 299-1997, IEEE Standard Method for Measuring the Effectiveness of Electromagnetic Shielding Enclosures, 44 Pages, 1997.
Leland H. Hemming, Architectural Electromagnetic Shielding Handbook—A Design Specification Guide, IEEE PRESS, 232 Pages, 1991.
USAF Handbook for the Design and Construction of HEMP/TEMPEST Shielded Facilities, AF Regional Civil Engineer Central Region, Dallas, Texas, 39 Pages, 1986.
ETS-Lindgren—High Performance EMI/RFI Shielding Solutions, 2 Pages, 2002.
ETS-Lindgren—Double Electrically Isolated RF Enclosures, for Industrial, Communication, and Research and Development Applications, 8 Pages, 2005.
ETS-Lindgren—Tempest Information Processing System (TIPS), 2 Pages, 2008.
ETS-Lindgren—Table Top Enclosure—5240 Series, 2 Pages, 2009.
ETS-Lindgren—Auto Latching Door System, 2 Pages.
ETS-Lindgren—RF Shielded Doors, 5 Pages.
NSA-94-106, National Security Agency Specification for Shielded Enclosures, 9 Pages, 1994.
Holland Shielding Systems BV, Shielding Gaskets With or Without Water Seal (EMI-RFI-IP Gaskets), 2 pages.
Holland Shielding Systems BV, EMI-RFI-EMP—Shielded Doors for Faraday Cages and EMI-RFI Shielded Room, 5 pages.
Holland Shielding Systems BV, Innovative EMI Shielding Solutions—Gasket Selection, 36 pages.
Equipto Electronic Corporation—Technical Guide to EMI/RFI Suppression in Electronic Cabinets, 16 pages, Apr. 2005.
Crenlo-Emcor-Product-Options-Doors, 12 pages.
RFI/EMI Shielded Cabinets and Features Available, 4 pages.
Special Door Company, Radiation Shielding Doors: SH Door Tech, 2 pages.
Special Door Company, EMP Doors: Electro Magnetic Pulse Doors, 3 pages.
Braden Shielding Systems, Anechoic Chambers, EMC Chambers, MRI Enclosures, 1 Page.
Magnetic Shield Corp.—Bensenville, Illinois, Magnetic Shielding, 2 Pages.
EEP—Electromagnetic Radiation Shielding & Magnetic Field Shielding Technology—Products and Services, 3 Pages.
FLEMING—RF & EMI Shielded Doors, Radiation Shielded Doors, 3 Pages.
H. Bloks, "NEMP/EMI Shielding," EMC Technology, vol. 5, No. 6, Nov.-Dec. 1986, 5 Pages.
W.E. Curran, "New Techniques in Shielding," ITEM, 1984, 9 Pages.
W. E. Curran, "Shielding for HEMP/TEMPEST Requirements," Item, 1988, 10 Pages.

* cited by examiner

MODULAR ELECTROMAGNETICALLY SHIELDED ENCLOSURE

CROSS REFERENCE TO RELATED APPLICATIONS

This application claims priority from U.S. Provisional Patent Application Ser. No. 61/252,534, filed Oct. 16, 2009; U.S. Provisional Patent Application Ser. No. 61/293,981, filed Jan. 11, 2010; and U.S. Provisional Patent Application 61/330,820, filed May 3, 2010; which are hereby incorporated by reference in its entirety.

TECHNICAL FIELD

The present disclosure relates to enclosures providing protection from electromagnetic fields. In particular, the present disclosure relates to a modular electromagnetically shielded enclosure, or to a system of electromagnetically shielded enclosures.

BACKGROUND

The use of highly developed electronics has provided the world with many applications that are integral to operation of financial, medical, electric-utility, and many other industries. The use of electronics is also integral to the operation of supporting infrastructure items such as the power grid, air conditioning, and emergency electricity-generation equipment.

Exposure to electromagnetic fields can cause interference or damage to such electronic equipment, causing that equipment to malfunction or rendering it nonoperational. These electronics are susceptible to being disrupted or damaged by electromagnetic interference, such as an electromagnetic pulse (generally characterized by frequencies between 14 kHz and 1 GHz) or intentional electromagnetic interference (generally characterized by frequencies between 10 MHz and 10 GHz) (EMP/IEMI) event. These electromagnetic events are capable of producing electromagnetic environments of much higher intensity than current electronic equipment is designed to operate in. Environments requiring the shielding of sensitive electronic equipment have not been considered in current standards for protection against electromagnetic interference and protection in these environments requires shielding sensitive electronic equipment in ways that have not been adopted in the industry related to electromagnetic compatibility is required.

Some methods for protecting electronic equipment from electromagnetic pulses are known in the art. For instance, high altitude nuclear electromagnetic pulse (HEMP) hardening has been used by the military for decades, and equipment and standards exists for protecting equipment from this and other electromagnetic threats. Standards are written toward protecting facilities, and physically substantial shielding is used in such construction. Electromagnetic shielding has been previously used to address discrete circumstances. Such examples are magnetic resonance imaging (MRI) rooms, shielding rooms used to test equipment and electromagnetic standards, shielding used in research facilities to protect sensitive equipment from interference. These standards, however, are used to adjust a narrow range of threats and thus systems developed to address a certain problem are not useful to address other problems necessitating electromagnetic shielding. A commoditized, standard electromagnetically shielded enclosure that can be used in several applications is desirable.

It is known in the art that a shield against EMP/IEMI events can be constructed making a solid electromagnetically conductive enclosure (sometimes called a "Faraday cage"). These enclosures lack practical applicability, however, as any attempt to access the interior of the enclosure disrupts the shielding effect and exposes any sensitive equipment housed in the enclosure to a timely EMP/IEMI event. Existing and planned data centers using such enclosures tend to be individually engineered in that the physical layout of the spaces is different from data center to data center. This type of approach leads to high design and construction costs. Moreover, existing methods for protecting sensitive electronics from electromagnetic interference are designed with a narrow range of applicability in mind and do not cover the entire range of potential EMP/IEMI threats. The enclosures of the present disclosure proposed are an engineered system that can be built at remote locations, hauled, and installed at the data center location with relative ease, efficiency, and cost effectiveness. Moreover, the enclosures of the present disclosure provide protection from a wide range of EMP/IEMI threats. Additionally, large-scale data centers typically used to perform operations in a number of industries are not currently designed with these concerns in mind, and are constructed in such a way to make modifications, whether for protection, expansion, or other reasons, extremely difficult.

For these and other reasons, improved solutions to EMP/IEMI threats which are cost and time-effective, and scalable, are desirable from a business standpoint.

SUMMARY

In accordance with the following disclosure, the above and other issues are addressed by the following.

In a first aspect, an enclosure providing shielding from EMP/IEMI events is disclosed. This enclosure includes a continuously-welded shell, at least one two-door sally port, and at least one point of grounding. The continuously-welded shell and each door of the two-door sally port are constructed from electromagnetically conductive materials. Such an enclosure permits access to the interior of the enclosure without disrupting the continuity of protection against potentially harmful EMP/IEMI events. Using methods known in the art, resources such as air, water, electricity, and electronic communications can be imported and exported into or out of the enclosure.

In a second aspect, an enclosure as described above that can be used as a modular assembly of independent, interconnected shells is disclosed. These shells can be connected using any of a variety of known electromagnetically-conductive connections, provided that all joints of the connection are continuously welded to provide continuous electromagnetic shielding. Resources such as air, water, electricity, and electronic communications can be shared between interconnected shells through these connections or through other, independent fixtures. A modular enclosure of this description can house equipment such as generators, chillers, electronic data storage servers, as well as a variety of sensors and detectors to make the enclosure completely self-sufficient.

In a third aspect, an enclosure as described above that can be used as a modular assembly of independent, interconnected shells is disclosed. These shells can be connected using any of a variety of known electromagnetically-conductive connections, provided that all joints of the connection are continuously welded to provide continuous electromagnetic shielding. Resources such as air, water, electricity, and electronic communications can be shared between interconnected shells through these connections or through other, independent fixtures. The enclosure includes at least one shell in which computing equipment operates 424, at least one shell in which power delivery equipment 410 operates, at least one shell in which cooling equipment 412 operates, and at least one shell in which an electric generator 416 operates. The enclosure may also include at least one external supplemental cooling apparatus 414 for cooling liquids or gases that is not electromagnetically shielded but is configured to operate without disruption during and after an EMP/IEMI event. The enclosure further includes at least one environmental sensor 418, such as a smoke detector, to monitor conditions within the enclosure.

In a fourth aspect, a method of manufacturing an electromagnetically shielded enclosure is disclosed. The method includes providing an electromagnetically conductive top, an electromagnetically conductive bottom, and a plurality of electromagnetically side walls. The method further includes positioning each of these elements so that they enclose an interior volume. The method further includes the step of continuously welding all seams formed between these elements. The method also includes a step of providing a sally port constructed of electromagnetically conductive material including a first door constructed from electromagnetically conductive material and a second door constructed from electromagnetically conductive materials. The method further includes the step of positioning the sally port so that at either the first or second door allows access to the interior volume of the enclosure. The method further includes at least one point of ground electrically connecting the enclosure to a reference ground.

Enclosures built according to the present disclosure provide shielding against electromagnetic shielding across a wide range of frequencies. Moreover, enclosures build according to the present disclosure are easily transported to the site of installation and can be easily arranged to suit the needs of a variety of applications by limiting engineering and construction costs.

DETAILED DESCRIPTION

Various embodiments of the present disclosure will be described in detail with reference to the drawings, wherein like reference numerals represent like parts and assemblies throughout several views. Reference to various embodiments does not limit the scope of the disclosure. Additionally, any examples set forth in this specification are not intended to be limiting and merely set forth some of the many possible embodiments for the present disclosure.

In general, the present disclosure relates to an electromagnetically shielded enclosure, and in particular an enclosure shielded against EMP/IEMI events.

The electromagnetically shielded enclosures of the present disclosure are configured to specifically protect against signals having a frequency between 14 kHz and 10 GHz, and having high electrical field (e.g., in excess of 100,000 Volts/meter). In certain embodiments of the present disclosure, the electromagnetically shielded enclosure is made from a number of portable units, forming a modular enclosure. Even in such arrangements, connections between individual modules are constructed to retain the electromagnetic shielding of each individual module. An enclosure built according to the present disclosure provides spatially- and temporally-continuous electromagnetic shielding while allowing access to an electronic instruments operating within the enclosure. An enclosure built according to the present disclosure also provides modularity, allowing expansion of the enclosure with relative ease.

Figure 1:
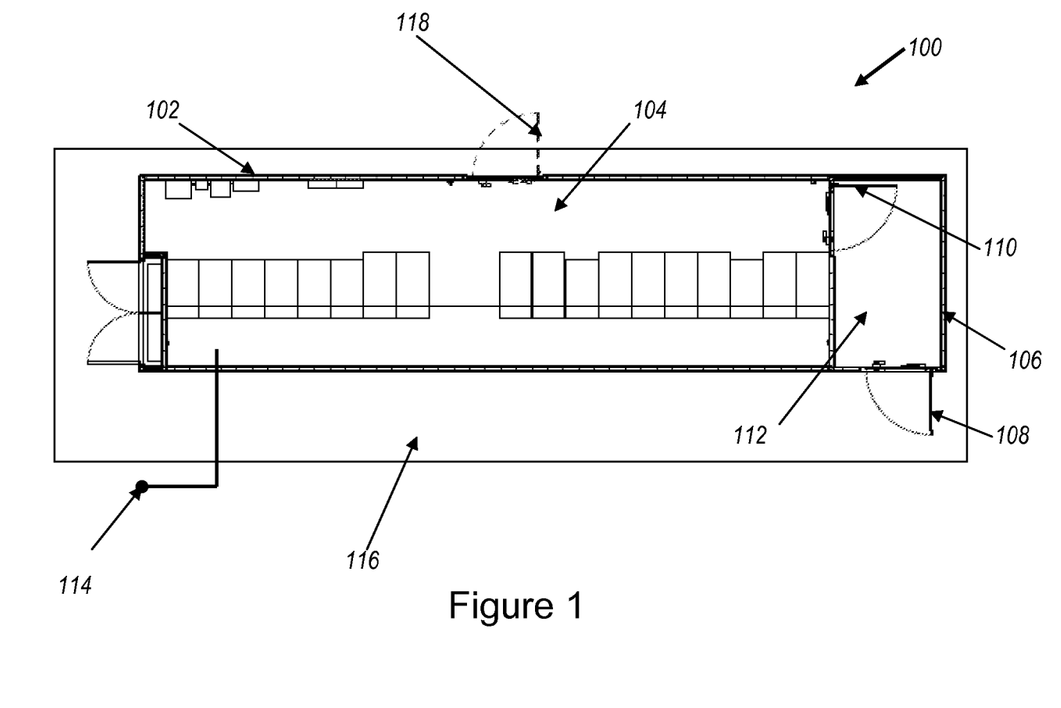
FIG. 1 is an overhead line drawing of an electromagnetically shielded enclosure according to an example embodiment of the present disclosure.

Referring to FIG. 1, an electromagnetically shielded enclosure 100 is provided. The enclosure includes a shell 102. The shell may take any shape, but must surround an interior volume 104 continuously in all directions. In the embodiment shown in FIG. 2, the shell includes a top 202, a bottom 204, and four side walls 206. Other numbers of sides, or configurations of the enclosure are possible as well. For example, the top 202 can include a pitched roof, or otherwise be altered in shape.

The shell 102 may take any size. In various embodiments, the shell 102 is sized to allow transportation via flatbed truck to a desired location. In one embodiment, the interior volume 104 is sized to receive electronic equipment and allow human entry. In another embodiment, the shell 102 is 12 feet wide, 49 feet long, and 10 feet 6 inches tall.

The shell 102 can be constructed from any electromagnetically conductive materials. In one embodiment, the electromagnetically conductive material is steel plate, for instance ¼-inch thick steel plate. In other embodiments the electromagnetically conductive material may be aluminum, copper, or any other electromagnetically conductive material or combination of materials. Any joints or seams formed at the intersection of two or more pieces of these construction materials must be continuously welded to provide for a complete electromagnetic shield.

The enclosure also includes a sally port 106 that is located at least partially within the shell 102. The sally port includes a first door 108 and a second door 110. The sally port defines a secondary interior volume 112 within the shell 102 and includes an intermediate shielded interior volume sized to allow human entry through one of the first 108 and second 110 doors. To provide continuous electromagnetic shielding, at least one of the first door 108 and second door 110 is closed at all times. Each of the first door 108 and the second door 110 is constructed from electromagnetically conductive materials. In one embodiment, the electromagnetically conductive material is steel, but alternative materials, such as aluminum, copper, or any other electromagnetically conductive material or combination of any such materials, may be used. Doors appropriate for use in an electromagnetically shielded enclosure as described are commercially available.

The enclosure must be suitably grounded. In one embodiment, the enclosure is grounded at a single point. In another embodiment, the enclosure is grounded at multiple points. All points of grounding 114 must be electrically connected to the shell 102. In order to ensure that the enclosure remains grounded at desired points, the shell 102 must be separated from the ground by a non-electromagnetically conductive spacer 116. In one embodiment, the spacer may be a neoprene pad, but other appropriate spacers may be used. In one embodiment, the spacer 116 is a flexible pad that allows physical movement related to expansion and contraction caused by temperature extremes found in some climates. In one embodiment, the spacer 116 also permits anchoring of the modules in a manner that prevents compromise of the desired points of ground by use of conductive fasteners.

The enclosure may include an emergency exit 118 that is constructed of the same materials as the doors of the sally port 106 described above. When closed, the emergency exit 118 will provide continuous electromagnetic shielding, but shielding will be disrupted when the emergency exit is opened.

Figure 2:
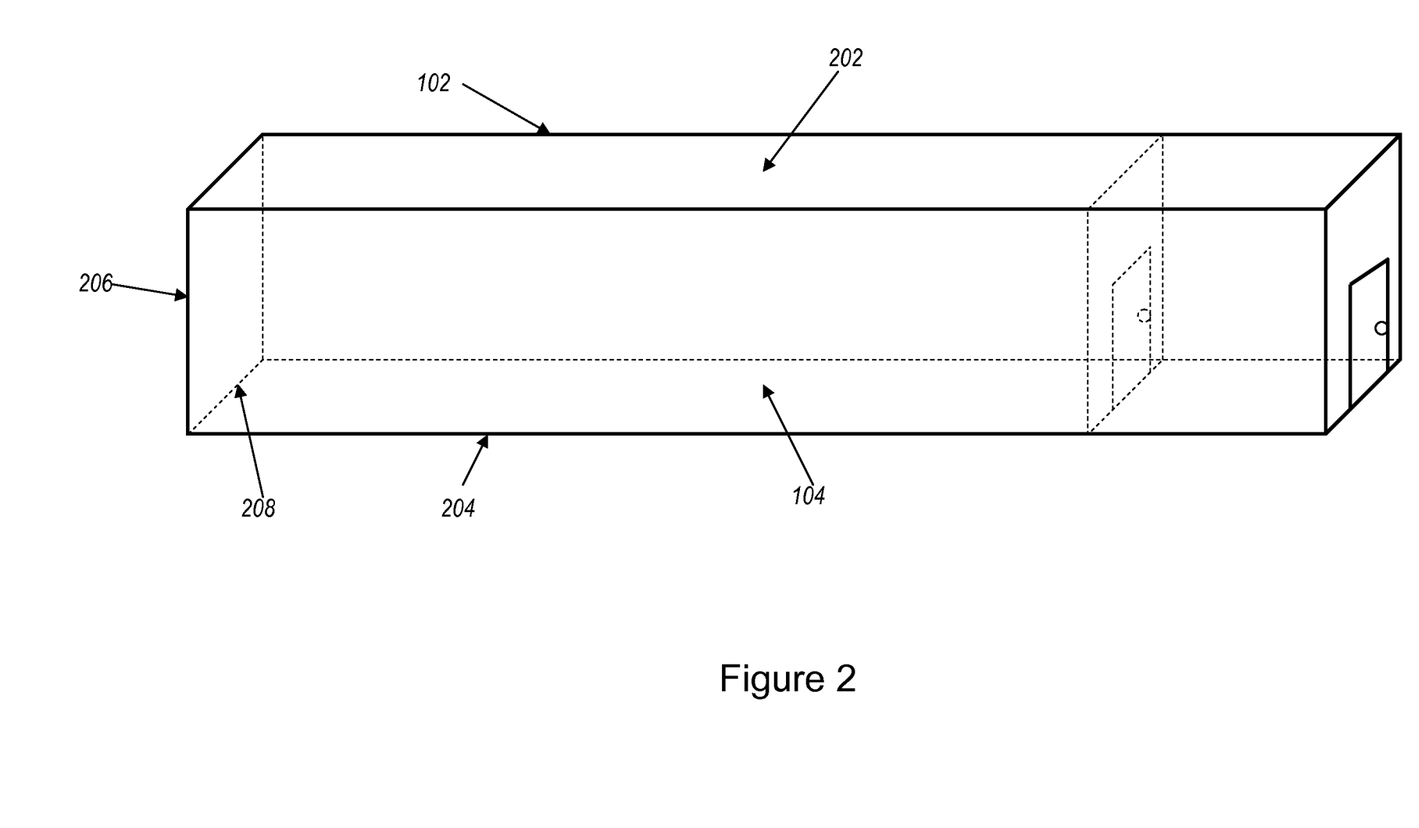
FIG. 2 is a perspective view of the electromagnetically shielded enclosure shown in FIG. 1.

In one embodiment, as shown in FIG. 2, the shell 102 includes a top 202, a bottom 204, and a plurality of side walls 206 enclosing interior volume 104. In this embodiment, each seam 208 joining the side walls 206, the top 202, and the bottom 206 must be continuously welded to ensure complete electromagnetic shielding.

The electromagnetically shielded enclosure described above may be constructed by providing a top, bottom, and plurality of side walls as described above and positioning these elements to form a shell with an interior volume. The seams formed between the top, bottom, and plurality of side walls must be continuously welded along their entire lengths to ensure proper electromagnetic shielding. A sally port can be incorporated into the enclosure by providing a two-door sally port as described above and positioning the sally port so that one door allows access to the interior volume of the shell. The enclosure must then be grounded by providing at least one point of grounding electrically connecting the shell to the reference ground.

Figure 3:
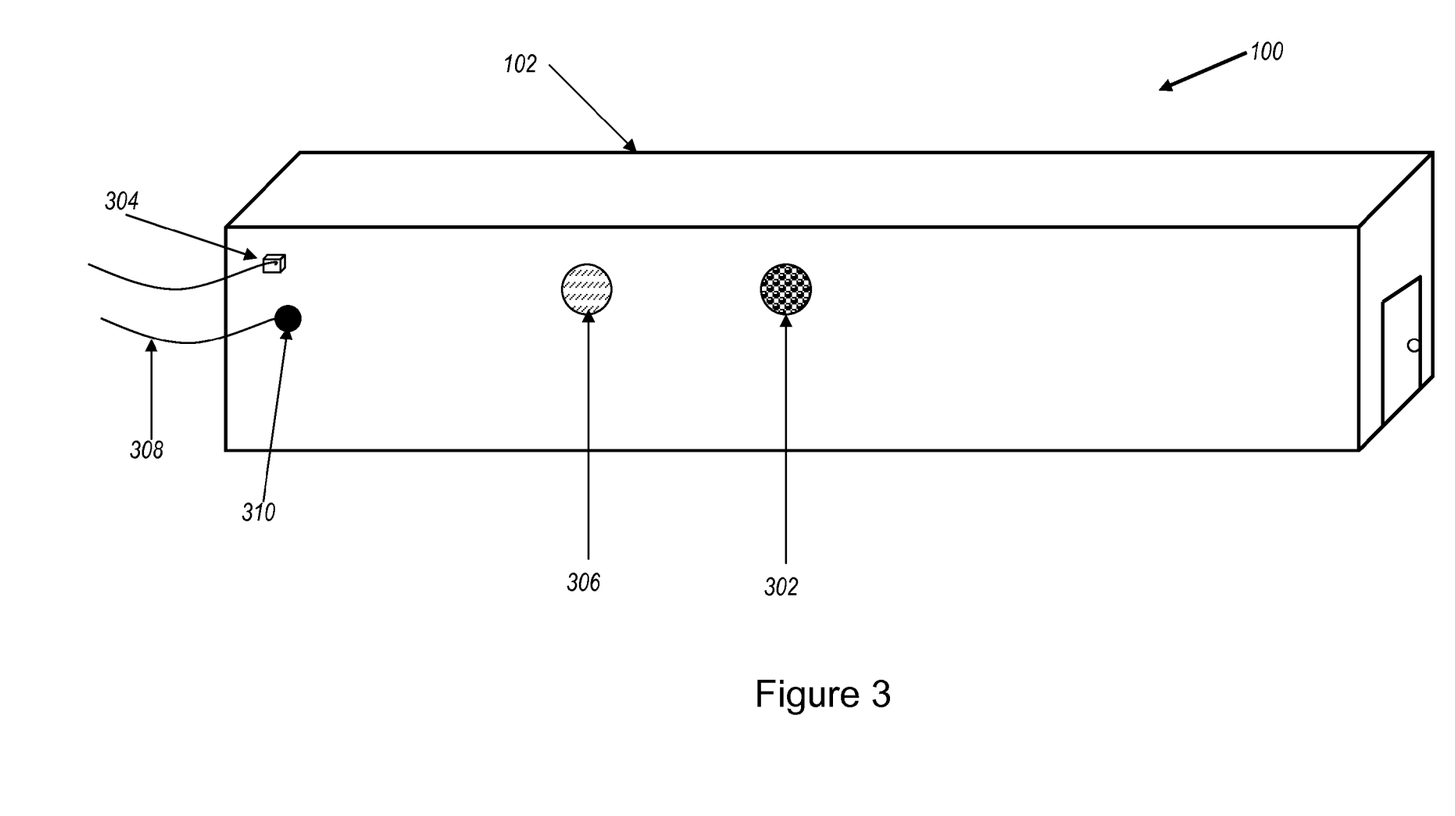
FIG. 3 is a perspective view of the electromagnetically shielded enclosure shown in FIG. 1.

Resources such as air, electricity, water, and electronic communications may be imported into or exported out of the enclosure. Referring now to FIG. 3, air exchange into and out of the enclosure 100 by providing a electromagnetically shielded vent 302 that penetrates shell 102. In one embodiment the seams between the shell 102 and the shielded vent 302 are continuously welded to ensure continuous protection. In another embodiment, mechanical attachment of vent 302 to the shell 102 and the use of an electromagnetically conductive gasket are disclosed. In one embodiment the vent 302 can include an opening that is guarded using any appropriate waveguide beyond cutoff that will sufficiently shield against EMP/IEMI threats. In another embodiment the vent includes a waveguide beyond cutoff configured to filter electromagnetic frequencies between approximately 14 kHz and 10 GHz. In yet another embodiment the vent 302 includes a waveguide beyond cutoff with individual cells having a diameter of 1 inch or smaller configured for a cutoff frequency of 10 GHz with minimum attenuation of 80 dB at this frequency. In one embodiment the dimensions of the waveguides include a cell diameter of ⅛ inch and a thickness of 1 inch.

Electricity may also be imported into the enclosure 100 through use of an appropriate electrical power filter 304 extending from external to the electromagnetic shielded enclosure 100 into the interior volume. The electrical power filter 304 may then be used to deliver power to electronic equipment held within the interior volume. Protection against power surges such as those caused by EMP or IEMI may be provided by the power filter 304. A number of commercially-available power filters may be used. In one embodiment, the power filter 304 is configured to filter electromagnetic signals carried on the electrical conductor between approximately 14 kHz and 10 GHz. In one embodiment, the seams between the shell 102 and the power filter 104 are continuously welded to ensure continuous protection. In another embodiment, mechanical attachment of power filter 304 to the shell 102 and the use of an electromagnetically conductive gasket are disclosed. The seams between the shell 102 and the power filter 304 must be continuously welded or gasketed to ensure continuous protection.

Electronic communications may be imported into the enclosure through use of an appropriate communicative connection 308 extending from external to the electromagnetic shielded enclosure 100 into the interior volume. The communicative connection 308 may, in one embodiment, be a fiber optic cable. To provide sufficient protection against EMP/IEMI events, a fiber-optic cable may be routed through a waveguide beyond cutoff 310. Any suitable fiber-optic waveguide may be used, but in one embodiment the fiber-optic waveguide 310 is configured to filter electromagnetic frequencies below 10 GHz.

Filtered conductive penetrations may be imported into the enclosure through use of an electrical filter 306. Any acceptable filter 306 may be used. In one embodiment, the filter 306 is configured to filter electromagnetic frequencies between 14 kHz and 10 GHz with 80 dB of attenuation at these frequencies. In one embodiment, the seams between the filter 306 and the shell 102 are continuously welded to ensure continuous protection. In another embodiment, mechanical attachment of filter 306 to the shell 102 and the use of an electromagnetically conductive gasket are disclosed. The seams between the shell 102 and the filter 306 must be continuously welded or gasketed to ensure continuous protection.

In addition to permitting exchange of resources between the interior volume of the enclosure and external, fixtures such as the shielded vent 302, electrical conduit 304, and communicative connection 308 may be configured to connect the shielded enclosure 100 to another shielded enclosure. Such configuration permits practical expansion of the total electromagnetically-shielded interior volume without compromising protection against EMP/IEMI events.

Figure 4:
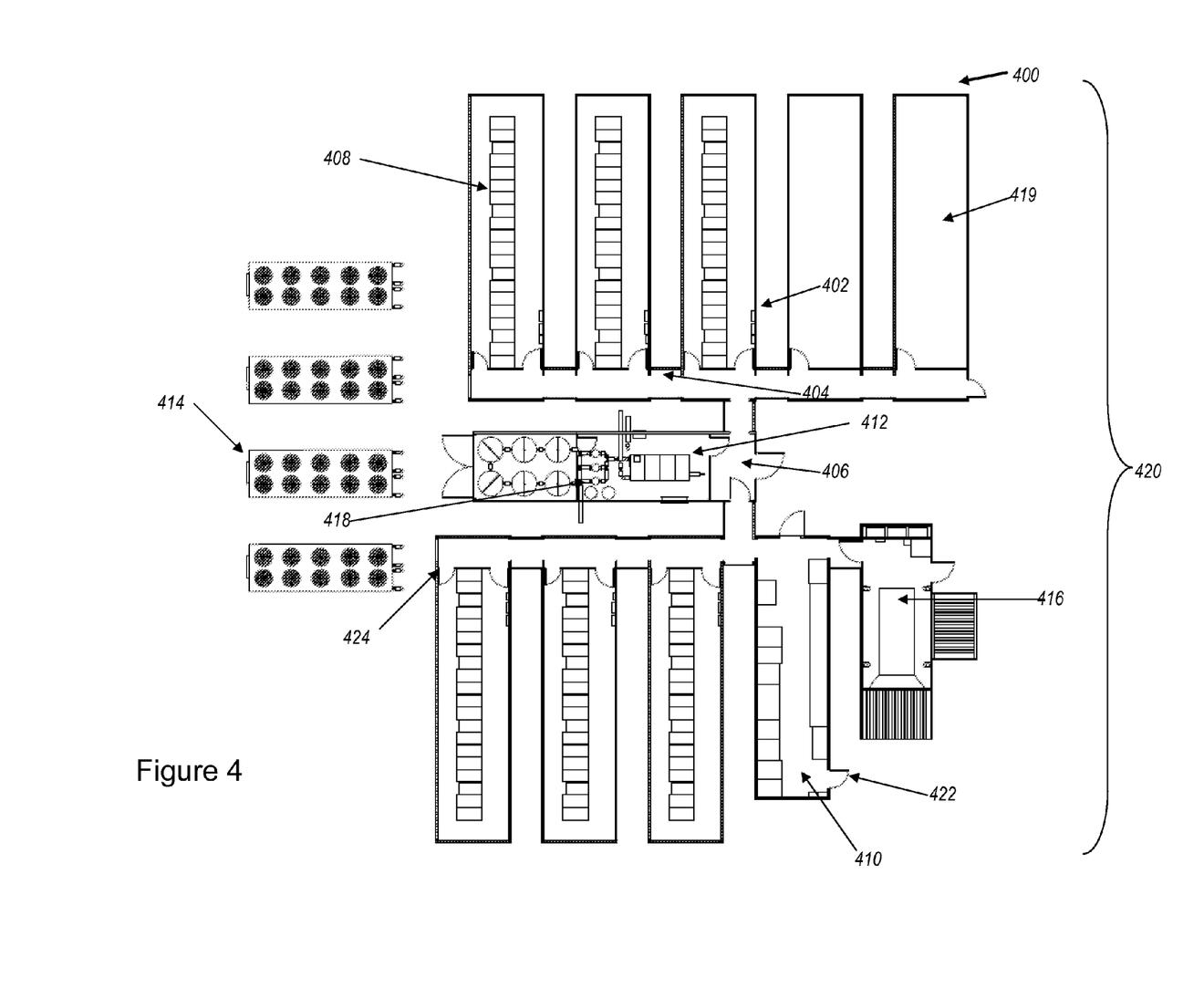
FIG. 4 is an overhead line drawing of a modular, electromagnetically shielded enclosure according to an example embodiment of the present disclosure.

The present disclosure also contemplates a modular, electromagnetically shielded enclosure that may be used to form an electromagnetically shielded data center. Referring now to FIG. 4, such a modular, electromagnetically shielded enclosure 400 is shown. The modular enclosure 400 is made up of a plurality of continuously-welded shells 402 constructed as described above. Each shell 402 is self-contained but interconnected with at least one other shell.

The connections 404 between each of the shells are each constructed from electromagnetically conductive materials. In one embodiment these connections are constructed from steel, but other conductive materials, such as aluminum, copper, and any other electromagnetically conductive material may be used. The shells 402 are joined with connections 404 that are electromagnetically conductive and continuous. In one embodiment the connection 404 between the modules is a continuously-welded common corridor that provides access to each of the shells 402 and permits the transport of resources between each of the shells 402. In another embodiment the connection 404 is a continuously welded conduit providing only for the exchange of resources. In one embodiment, the connection 404 is located at one end of each shell 402, but other configurations are possible. For instance, a common connection 404 may run through the middle of multiple shells 402.

As presently described, the modular enclosure 400 includes at least one sally port 406 located at least partially within one of the plurality of continuously welded shells 402. The sally port is constructed as described above and is constructed from electromagnetically conductive materials. In one embodiment, the sally port is constructed from steel, but other conductive materials, such as aluminum and copper may be used.

A variety of electronic equipment may be housed within the modular, electromagnetically shielded enclosure 400. For instance computing equipment 408 may be housed within the interior volume of any of the continuously welded shells 402. In one embodiment, power delivery equipment 410 may be operated within the interior volume of at least one of the plurality of shells 402. The power delivery equipment 410 may be configured to deliver power to the computing equipment 408. Any acceptable power delivery equipment 410 may be used. In another embodiment, cooling equipment 412 may be operated at least partially within the interior volume of at least one of the plurality of shells 402. The cooling equipment 412 may be configured to circulate cooled fluid throughout the interior volumes of each of the plurality of shells 402. Any acceptable cooling equipment 412 may be used. Other equipment, such as an electrical generator 416 and/or sensitive instruments, may be housed in interior volume of one of the shells 402.

A modular enclosure 400 like that shown in FIG. 4 may also include support shells 419 dedicated to support the equipment operating within other shells. In one embodiment, these support shells 419 are used as living quarters, but other uses are contemplated. In another embodiment, the modular system is constructed so that individual users have access only to specific shells, for instance through secured doors, for increased security or separation of computer equipment.

In embodiments of an electromagnetically shielded enclosure including more than one shell (e.g., enclosure 400), different shells can be used to house different categories of electronic equipment. For example, in certain embodiments, one shell could have its interior volume dedicated to storage of computing equipment 408, while a second shell could have its interior volume dedicated to power delivery equipment 410. In still further embodiments, including single-shell embodiments, such as that shown in FIGS. 1 through 3, a mixed set of types of electronic equipment could be included within a single shell, forming a complete data center within a single shell.

Although in the embodiment shown a particular layout of computing equipment 408, power delivery equipment 410, and cooling equipment 412 is illustrated, it is recognized that other arrangements are possible as well. For example in certain arrangements, a number of modules including computing equipment can be included in shells 402 that are separable by access doors 424. The access doors can be electromagnetically shielded in the same manner as the doors 108, 110 of the sally port, but also can include either key-based or keycard-based access controls, such that only certain individuals having access to the interior of the enclosure 400 can in fact access that equipment. This may be useful, for example, in a collocation facility in which different corporate entities or interests have separate sets of computing resources at the same facility, but due to security concerns or other data concerns those entities should not have physical access to other companies' dedicated computing equipment.

Additionally, one or more sensors can be included in or near one or more of the shells of a particular enclosure. For example, in various embodiments, the sensors can include environmental detectors 418, such as electrical field detectors, thermostats, barometers, humidity, carbon monoxide, carbon dioxide, and smoke detectors may also be housed within the interior volume of at least one of the shells 402. In such embodiments, the sensors can be communicatively interconnected, and can be configured to communicate sensed values to a remote location, to allow remote or centralized monitoring of conditions at different points within or external to the shells 402.

Constructed in this manner, the modular, the electromagnetically shielded enclosure can form a modular data center 420, in which various computing equipment can be located on one or more such arranged shells.

Should they be required, the modular enclosure may also include one or more emergency exists 422 that are not part of a sally port. These emergency exits 422 are constructed of electromagnetically conductive materials, such as steel, but opening these exits will disrupt electromagnetic shielding.

Figure 5A:
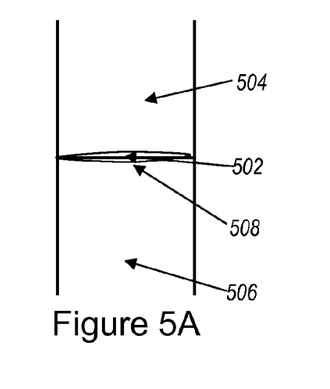
FIG. 5A is an overhead line drawing of a connection between two continuously-welded shells forming a portion of a modular, electromagnetically shielded enclosure.
Figure 5B:
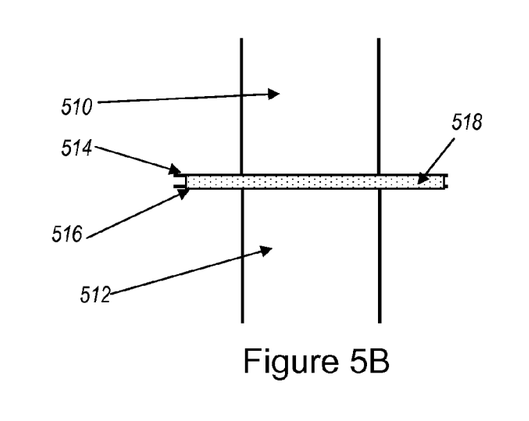
FIG. 5B is an overhead line drawing of a connection between two continuously-welded shells forming a portion of a modular, electromagnetically shielded enclosure.

In a modular enclosure as describe above, physical connection between individual shells may be accomplished in a variety of ways. In one embodiment, shown in FIG. 5A, the seam 502 between a first shell 504 and a second shell 506 may be joined by a continuous weld 508. In another embodiment, shown in FIG. 5B, a first shell 510 and a second shell 512 may be joined in a flange and gasket system such that a first flange 514, forming a portion of the first shell 510, is connected to a second flange 516, forming a portion of the second shell 512. An electromagnetically conductive gasket 518 is disposed between the flanges 514 and 516. The first flange 514 and the second flange 516 may be joined by mechanical means or continuous welding.

Figure 6:
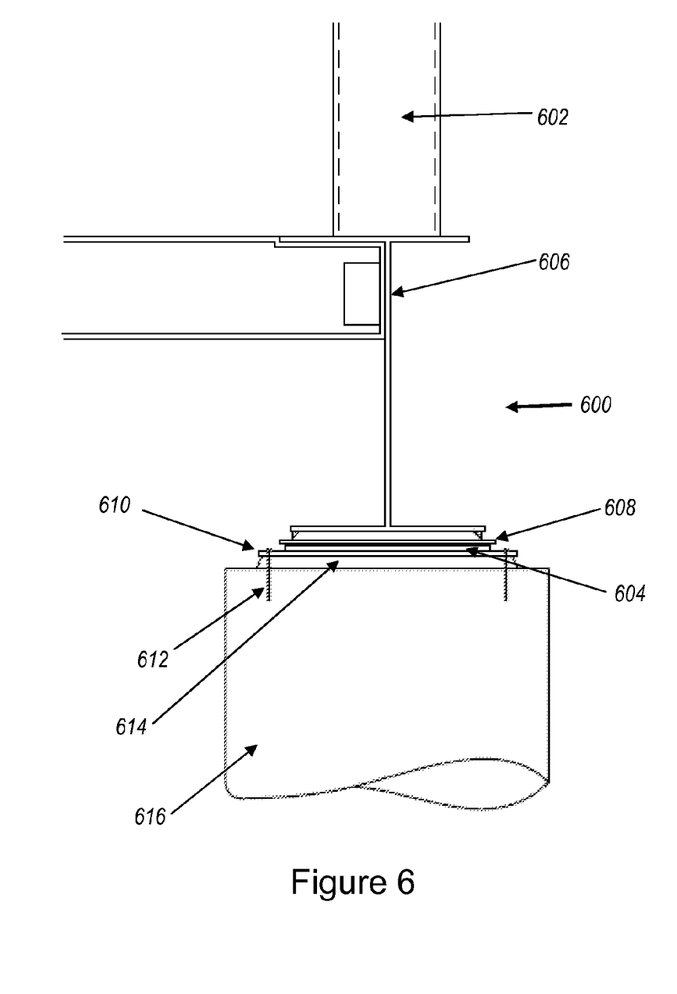
FIG. 6 is a perspective view of a support mechanism forming a portion of a modular, electromagnetically shielded enclosure.

Each shell of the shielded enclosure described above may be secured by a support mechanism 600 in a fashion that enables movement of the shells independently and ensures the enclosures stay grounded at only desired points. In one embodiment, the shell 602 sits upon a nonconductive pad 604, such as a neoprene pad. In another embodiment, the shell 602 sits directly on a beam 606. The beam 606 is, in turn, supported by a plate 608. In one embodiment the plate 608 is a 10-gauge stainless steel plate with a length and width of 8 inches. The plate 608 rests upon a nonconductive pad 604. In one embodiment the nonconductive pad 604 is a neoprene/fiber pad with a typical length and width of 7 inches and a thickness of ¾ inch. The nonconductive pad 604 rests upon a bearing plate 610. In one embodiment the bearing plate 610 is an 8 inch by 12 inch, 10-gauge stainless steel plate, but other plates may be used. The bearing plate rests upon a layer of grout 614. The grout rests upon a drilled pier 616. In one embodiment the pier is a 16 inch drilled pier, but other piers may be used. The plate 608, nonconductive pad 604, bearing plate 610, and grout 614 are secured to the pier by a plurality of screw anchors 612. In one embodiment the screw anchors 612 are ½ inch diameter stainless steel screw anchors.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An electromagnetically shielded enclosure comprising:
   (a) a continuously-welded shell having a top, a bottom, and a plurality of side walls cooperating to enclose an interior volume, the interior volume sized to receive electronic equipment and allow human entry, the continuously-welded shell constructed from electromagnetically conductive materials and including welds along seams joining the side walls, the top, and the bottom;

(b) at least one sally port located at least partially within the shell, the at least one sally port including a first door in one of the plurality of side walls and constructed from electromagnetically conductive materials and a second door constructed from electromagnetically conductive materials, the sally port defining a secondary interior volume within the continuously-welded shell and including an intermediate shielded interior volume sized to allow human entry through one of the first and second doors such that at least one of the first and second doors remains closed; and (c) an electrical connection sufficient to ground the continuously-welded shell to a reference ground, wherein the continuously-welded shell is otherwise isolated from ground by a nonconductive pad.

2. The enclosure of claim 1, wherein only one of said first door and said second door may be opened at any one time.

3. The enclosure of claim 1, wherein the desired points enclosure is grounded at a depth of 18 inches below grade.

4. The enclosure of claim 1, wherein the continuously-welded shell is constructed from steel plate.

5. The enclosure of claim 1, further comprising a ventilation system including a waveguide beyond cutoff, the ventilation system allowing air exchange between the interior of the electromagnetically shielded enclosure and the exterior of the electromagnetically shielded enclosure.

6. The enclosure of claim 5, wherein the waveguide beyond cutoff is configured to filter electromagnetic frequencies between approximately 14 kHz and 10 GHz.

7. Then enclosure of claim 1, further comprising an electrical signal originating from external to the electromagnetic shielded enclosure into the interior volume, the electrical signal delivering a power signal to electronic equipment held within the interior volume.

8. The enclosure of claim 7, further comprising a power filter applied to the electrical conduit, the power filter configured to filter electromagnetic signals carried on the electrical conduit between approximately 14 kHz and 10 GHz.

9. The enclosure of claim 1, further comprising a communicative connection extending from external to the electromagnetic shielded enclosure into the interior volume.

10. The enclosure of claim 9, wherein the communicative connection includes a fiber optic cable.

11. The enclosure of claim 10, further comprising a waveguide beyond cutoff allowing passage of the fiber optic cable into the electromagnetically shielded enclosure.

12. The enclosure of claim 1, further comprising a conductive electromagnetism filter extending from external to the electromagnetic shielded enclosure into the interior volume.

13. The enclosure of claim 12, wherein the conductive electromagnetism filter is configured to filter conductive electromagnetic forces between approximately 14 kHz and 10 GHz.

14. The enclosure of claim 1, wherein the continuously-welded shell is configured for electrical and communicative connection to at least one other electromagnetically shielded enclosure.

15. The enclosure of claim 1, wherein the nonconductive pad is a neoprene pad.

16. The enclosure of claim 1, wherein the continuously-welded shell is isolated from ground by a support mechanism.

17. The enclosure of claim 16, wherein the support mechanism further comprises a beam, a plate, a nonconductive pad, a bearing plate, and a pier, or piers with grade beams, wherein a beam is supported by the plate, the plate rests upon the nonconductive pad, the nonconductive pad rests upon the bearing plate and the plate, nonconductive pad, and bearing plate are secured to the pier by a plurality of screw anchors.

18. A modular, electromagnetically shielded enclosure comprising:

(a) a plurality of self-contained, interconnected, continuously-welded shells, each shell having a top, a bottom, and a plurality of side walls cooperating to enclose an interior volume, the interior volume of at least one of the shells sized to receive electronic equipment and allow human entry, the continuously-welded shell constructed from electromagnetically conductive materials and including welds along seams joining the side walls, the top, and the bottom;

(b) at least one sally port located at least partially within one of the plurality of self-contained, continuously-welded shells, the at least one sally port including a first door in one of the plurality of side walls and constructed from electromagnetically conductive materials and a second door constructed from electromagnetically conductive materials, the sally port defining a secondary interior volume within the continuously-welded shell and including an intermediate shielded interior volume sized to allow human entry through one of the first and second doors such that at least one of the first and second doors remains closed; and (c) one or more electrically grounding connections electrically connecting the entire plurality of self-contained continuously welded shells to a reference ground, wherein the continuously-welded shell is otherwise isolated from ground by a nonconductive pad.

19. The enclosure of claim 18, wherein each of the plurality of interconnected shells are joined at one or more continuously welded connections.

20. The enclosure of claim 19, wherein the one or more continuously welded connections comprises an electromagnetically shielded common corridor.

21. The enclosure of claim 19, wherein the one or more continuously welded connections comprises an electromagnetically shielded conduit.

22. The enclosure of claim 18, wherein all connections between said shells comprise a first flange extending from a first shell and a second flange extending from a second shell and wherein the first flange and the second flange are mechanically connected.

23. The enclosure of claim 18, further comprising computing equipment operating within an interior volume of at least one of the plurality of shells.

24. The enclosure of claim 18, further comprising power delivery equipment operating within an interior volume of at least one of the plurality of shells, the power delivery equipment configured to deliver power to the computing equipment.

25. The enclosure of claim 18, further comprising cooling equipment operating at least partially within the interior volume of at least one of the plurality of shells, the cooling equipment configured to circulate cooled air throughout the interior volumes of each of the plurality of shells.

26. The enclosure of claim 18, wherein the plurality of shells forms a modular data center.

27. The enclosure of claim 18, further comprising at least one environmental detector operating within the interior volume of at least one of the plurality of shells.

28. The enclosure of claim 27, wherein the environmental detector is selected from the group consisting of: electric field sensors, thermostats, barometers, and smoke detectors, humidity detectors, carbon monoxide detectors, and carbon dioxide detectors.

29. The enclosure of claim 18, further comprising at least one support shell included in the plurality of shells.

30. The enclosure of claim 29, wherein the at least one support shell comprises living quarters.

31. A modular, electromagnetically shielded enclosure comprising:
(a) a plurality of self-contained, interconnected, continuously-welded shells, each shell having a top, a bottom, and a plurality of side walls cooperating to enclose an interior volume, the interior volume of at least one of the shells sized to receive electronic equipment and allow human entry, the continuously-welded shell constructed from electromagnetically conductive materials and including welds along seams joining the side walls, the top, and the bottom;
(b) at least one sally port located at least partially within one of the plurality of self-contained, continuously-welded shells, the at least one sally port including a first door in one of the plurality of side walls and constructed from electromagnetically conductive materials and a second door constructed from electromagnetically conductive materials, the sally port defining a secondary interior volume within the continuously-welded shell and including an intermediate shielded interior volume sized to allow human entry through one of the first and second doors such that at least one of the first and second doors remains closed;
(c) electrically grounding the entire plurality of self-contained continuously welded shells to a reference ground;
(d) computing equipment operating within an interior volume of at least one of the plurality of shells;
(e) power delivery equipment operating within the interior volume of at least one of the plurality of shells, the power delivery equipment configured to deliver power to the computing equipment;
(f) cooling equipment operating at least partially within the interior volume of at least one of the plurality of shells, the cooling equipment configured to circulate cooled air throughout the interior volumes of each of the plurality of shells;
(g) an electric generator operating at within the interior volume of at least one of the plurality of shells; and
(h) access controls configured to allow different entities different levels of access;
wherein all connections between said shells are continuously welded and wherein resources are transported between each of the interconnected shells through said connections.

32. A method of manufacturing an electromagnetically shielded enclosure comprising the steps of:
(a) providing an electromagnetically conductive top, an electromagnetically conductive bottom, and a plurality of electromagnetically conductive side walls, said top, bottom, and plurality of side walls to enclose an interior volume;
(b) positioning the enclosure on a nonconductive pad
(c) continuously welding along all seems formed between said top, bottom, and plurality of side walls;
(d) providing at least one sally port constructed of electromagnetically conductive material comprising a first door constructed from electromagnetically conductive material and a second door constructed from electromagnetically conductive materials;
(e) positioning said sally port so that at least one of said first door and said second door allows access to the interior volume of enclosure; and
(f) providing at least one point of ground electrically connecting the enclosure to a reference ground.

* * * * *